(12) United States Patent
Popovic et al.

(10) Patent No.: US 9,967,059 B2
(45) Date of Patent: May 8, 2018

(54) METHOD FOR CONCURRENT TRANSMISSION OF INFORMATION SYMBOLS IN WIRELESS COMMUNICATION SYSTEMS

(71) Applicant: Huawei Technologies Co., Ltd., Shenzhen (CN)

(72) Inventors: Branislav Popovic, Kista (SE); Anahid Robert Safavi, Kista (SE)

(73) Assignee: Huawei Technologies Co., Ltd, Shenzhen (CN)

(*) Notice: Subject to any disclaimer, the term of this patent is extended or adjusted under 35 U.S.C. 154(b) by 247 days.

(21) Appl. No.: 14/979,862

(22) Filed: Dec. 28, 2015

(65) Prior Publication Data
US 2016/0112158 A1 Apr. 21, 2016

Related U.S. Application Data

(63) Continuation of application No. PCT/EP2013/063999, filed on Jul. 3, 2013.

(51) Int. Cl.
*H04L 27/28* (2006.01)
*H04L 1/00* (2006.01)
(Continued)

(52) U.S. Cl.
CPC ...... *H04L 1/0071* (2013.01); *H03M 13/2707* (2013.01); *H04L 5/0005* (2013.01); *H04L 5/0021* (2013.01); *H04L 5/026* (2013.01); *H04L 27/2601* (2013.01); *H04L 27/2636* (2013.01); *H03M 13/23* (2013.01); *H03M 13/635* (2013.01)

(58) Field of Classification Search
CPC . H04L 1/0071; H04L 1/0067; H04L 27/2601; H04L 5/0005; H04L 5/0021; H04L 1/0618; H04L 1/0048; H04L 1/0058; H03M 13/2707; H03M 13/635; H03M 13/1102; H04B 1/707; H04B 2201/70703; H04B 7/061; H04B 7/0413; H04B 7/0456
See application file for complete search history.

(56) References Cited

U.S. PATENT DOCUMENTS

| 9,735,809 B2* | 8/2017 | Jeong ................ H03M 13/2792 |
| 2011/0002412 A1* | 1/2011 | Hou ..................... H04B 7/0413 375/267 |

(Continued)

OTHER PUBLICATIONS

Hoshyar, R., et al., "LDS-OFDM an Efficient Multiple Access Technique," IEEE 71st Vehicular Technology Conference, May 16, 2010, pp. 1-5, Taipei.

(Continued)

*Primary Examiner* — Khanh C Tran
(74) *Attorney, Agent, or Firm* — Slater Matsil, LLP

(57) ABSTRACT

The present invention relates to methods for concurrent transmission and reception of information symbols over time-frequency resource elements in a wireless communication system. According to the present invention coded bits interleaving is combined with symbol spreading using LDS signatures. Thereby, the performance of coded LDS transmissions can be substantially improved in wireless communication systems. Furthermore, the invention also relates to corresponding transmit device, receiver device, computer program, and computer program product.

12 Claims, 9 Drawing Sheets

(51) Int. Cl.
*H03M 13/27* (2006.01)
*H04L 5/00* (2006.01)
*H04L 5/02* (2006.01)
*H04L 27/26* (2006.01)
*H03M 13/23* (2006.01)
*H03M 13/00* (2006.01)

(56) References Cited

U.S. PATENT DOCUMENTS

| | | | | |
|---|---|---|---|---|
| 2013/0230119 A1* | 9/2013 | Dhakal | ............... | H04B 7/0456 375/295 |
| 2014/0016571 A1* | 1/2014 | Yucek | .................. | H04L 1/0071 370/329 |
| 2014/0169239 A1* | 6/2014 | Maaref | ............ | H04W 72/0446 370/280 |
| 2014/0169408 A1* | 6/2014 | Bayesteh | ............ | H04B 7/0473 375/144 |
| 2014/0369434 A1* | 12/2014 | Taherzadehboroujeni | | H04B 7/0456 375/261 |

OTHER PUBLICATIONS

Kabashi, A.H., et al., "Low Complexity CMC-CDM Based Wireless LAN With Different Interleaving Approaches," IEEE 19th International Symposium on Personal, Indoor and Mobile Radio Communications, Sep. 15, 2008, pp. 1-5, Cannes.

* cited by examiner

METHOD FOR CONCURRENT TRANSMISSION OF INFORMATION SYMBOLS IN WIRELESS COMMUNICATION SYSTEMS

This application is a continuation of International Application No. PCT/EP2013/063999, filed on Jul. 3, 2013, which is hereby incorporated by reference in its entirety.

TECHNICAL FIELD

The present invention relates to methods for concurrent transmission of information symbols over time-frequency resource elements in wireless communication systems. Furthermore, the invention also relates to a corresponding method in a transmitter, a transmit device, a receiver device, a computer program, and a computer program product thereof.

BACKGROUND OF THE INVENTION

Spectrum spreading of information symbols is a simple method to achieve frequency diversity over a multipath, frequency-selective fading propagation channel, as well as a method for simultaneous multiple-access by a number of users to the same communication channel. Spread-spectrum communication systems with multiple-access capability based on user-specific spreading signatures (also referred to as codes, or sequences) are usually called Code-Division Multiple-Access (CDMA) systems. Multiple-access capability is based on low (ideally zero) cross-correlation between the signatures. Multipath propagation deteriorates the performance of CDMA systems, as the multiple reflections of each signature element result in the distortion of the transmitted signatures. The cross-correlations of the received, distorted signatures deviate from the designed minimized values.

On the other hand, Orthogonal Frequency-Division Multiplexing (OFDM) transmission uses a transmitted cyclic prefix for each block of transmitted symbols to make, in the receiver, the multipath fading channel appear as a single-path channel on each of the orthogonal detected subcarriers. Such a property allows for much simpler receivers than in CDMA systems, when the transmission is over multipath propagation channels. However, by its very nature an OFDM system cannot directly exploit the potential diversity gain of the multipath fading channel.

To make a compromise between the diversity gain and multiple-access capability of CDMA systems, and the receiver simplicity pertained to OFDM systems, so-called MC-CDMA systems have been developed, where n information symbols (possibly obtained after error-correction encoding) are transmitted concurrently (i.e. summed) after spreading and sub-carrier mapping: each information symbol is first multiplied (i.e. spread) by a unique corresponding signature, a sequence of m spreading symbols (chips), and then mapped to a set of m orthogonal sub-carriers, common to all concurrently transmitted information symbols, where each chip of the spread information symbol modulates a dedicated sub-carrier. Finally, the signal obtained by the previous operations is extended by preceding it with the so-called cyclic prefix, which is a block of samples taken from the end of the original signal. In the overloaded case, i.e. the situation where n>m, there are more signature sequences than chips. In this case no orthogonal signature sets exists and interference is inherent.

The operations of sub-carrier mapping and adding the cyclic prefix do not have impact on the properties of Low-Density Spreading (LDS) transmissions on Additive White Gaussian Noise (AWGN) channel. Thus, we shall model the received signal vector r consisting of n received chip-values after passing through a channel, as the following relation:

$$r = Sx + z, \quad (1),$$

where S is the m×n signature matrix (each signature being a column of this matrix), X is the column vector containing the modulation symbols, and Z is the column vector containing the complex-valued samples of white additive Gaussian noise.

The optimum demodulator for overloaded MC-CDMA transmission is the joint Maximum Likelihood (ML) detection of the set of information symbols transmitted concurrently using different signatures. Such demodulator is typically too complex for practical use, as it has to search through all possible sequences of n information symbols, so a large variety of suboptimal Multiuser Demodulation (MUD) methods have been developed. All suboptimal MUD methods are, in one way or another, approximations of joint ML demodulation.

The MUD receivers are typically still very complex, the complexity increasing non-linearly with the length of signatures. Traditionally, MUD methods have been independent of the signature design, in which case the MUD implementation complexity is dependent only on the number of signatures. It has however recently been demonstrated that the MUD complexity can be reduced by specially designed sparse signatures, accompanied with the usage of Belief Propagation joint Multiuser Demodulation (BP-MUD). If we denote an information symbol modulating a signature as a symbol variable, then the BP-MUD can be described as performing the ML searching on each chip, but only over a (small) set of information symbols that contribute to the energy of each particular chip. That set is defined by the non-zero elements in each row of the LDS signature matrix. Such sparse signatures contain only few chips where the energy is actually transmitted, i.e. each of them has only few non-zero elements. Therefore they are called Low-Density Spreading (LDS) signatures.

An LDS signature of length m is a sequence of m spreading symbols (chips) such that $w_c$ chips are not equal to zero, while $m-w_c$ are equal to zero, so that $w_c \ll n$. The LDS transmission combined, e.g. with OFDM (i.e. LDS-OFDM) is an attractive candidate for future high-capacity wireless communication systems, developed on the foundation of the existing OFDM based global cellular standard (i.e. 3GPP LTE). The concept of LDS-OFDM transmission is shown in FIG. 1 in which LDS spread information symbols are summed into a single vector of length 12 chips, wherein the chips modulate the corresponding subcarriers within an OFDM transmission interval. Further, the FFT processor in FIG. 1 maps frequency domain signal samples into time domain signal samples at its output.

The corresponding BP-MUD demodulator aims at approximating the ML detector by iterating belief values and assumes that the signature matrix S is of the so-called Low-Density Parity-Check (LDPC) type. The BP-MUD demodulator has considerably lower complexity than the ML detector and its performance can be close to that of the MAP detector. The BP-MUD is applicable to any choice of the actual values of the signature sequences.

However, the error rate performances of detected information bits in the receiver do depend on the choice of signature sequences. For example, in noise-free conditions it should be possible to unambiguously detect the information symbols that modulate the different LDS signatures. This is possible only if the modulated signatures represent a Uniquely Decidable (UD) code, as shown in the paper by van de Beek and Popovic from IEEE GLOBECOM 2009 conference.

For the overloaded scenarios, the performance of the system can typically be measured as the gap to the single-user bound (the performance on AWGN channel of a system employing only one user, hence free from inter-user interference). The single-user bound performance can is equivalent to the performance of a CDMA system with load factor 1, using the identity matrix as the signature matrix.

This gap in performance between LDS transmission and the corresponding single user transmission using the same coding and modulation format is mainly a function of the overloading factor and the modulation format (i.e. constellation size) of the information symbols.

The functional block structure of a typical transmitter in a conventional digital wireless communication system is given in FIG. 2. The information bits are grouped in blocks, and each block of information bits is encoded by error correction encoder in order to be protected against additive white Gaussian noise (AWGN) at the receiver. The encoder, for example, a convolutional encoder, produces so-called "mother" code word. The corresponding code rate $R_m$, defined as the ratio of the number of information bits encoded in a single code word divided by the number of bits in the code word, is called mother code rate. For some applications the code word size has to be adjusted to match available physical resources for the transmission, which is done in the rate matching block, by either puncturing (to shorten the mother code word) or repetition (to extend the mother code word).

Typical and the best error correction codes are designed to protect against the statistically independent errors. For example, such errors occur on AWGN communication channel. However, on fading communication channel, which causes large amplitude variations of the received signal, the received signal amplitude can be below a detection threshold during a number of signalling intervals, resulting in bursts of erroneously received information symbols. Because of that, the errors on the received bits are not statistically independent, and therefore the error correction code designed for AWGN channel would not be capable to effectively protect information on burst-error communication channels.

A simple and effective method for bit error correction on burst-error channels is to use already designed codes for AWGN channels along with an additional functional block, called (channel) bit interleaver, which performs permutation of the bits of each (rate matched) code word. The corresponding inverse permutation of received bits is performed in the channel bit deinterleaver, before error correction decoder. Obviously, the deinterleaver transforms a burst of errors into a disperse pattern of errors. The more disperse error pattern after deinterleaver, the better performances of error correction decoder will be achieved. The optimum bit interleaver for a given code word length is such permutation that makes two successive bits in the permuted code word being at the maximum possible distance before interleaving (counted in number of bit positions between them). Note that on AWGN channel the interleaver and the deinterleaver have no impact on the link performances. Therefore, in the applications where the communication channel is only of AWGN type, the channel bit interleaver and deinterleaver are not used. Therefore the channel bit interleaver in FIG. 2 is denoted as optional.

In FIG. 3, a general receiver block diagram is shown, corresponding to the transmission scheme shown in FIG. 2. The demodulator of FIG. 3 produces soft values of bits transmitted by each information symbol. These soft values are deinterleaved and fed into the error correction decoder, which typically is a convolutional or a turbo decoder in common systems.

The LDS transmission defined up to date is similar to the conventional one, with the only difference in the last stage of the transmitter chain, where LDS Transmitter (Tx) stage is added, to perform spreading and concurrent transmission of multiple information symbols. The functional block structure of the LDS transmitter of the prior art is given in FIG. 4. It should be noted at this point that the channel bit interleaver is optional in the LDS transmitter, meaning that the channel bit interleaver is not used if the communication channel is of AWGN type.

The corresponding state-of-the-art LDS receiver is shown in FIG. 5. The BP-MUD demodulator in FIG. 5 produces soft values (Log Likelihood Ratio—LLR) of the coded bits that are, after deinterleaving (performed only if there is a bit interleaving operation in the transmitter), fed to the error correction decoder. The LLR calculation in BP-MUD demodulator is done once the BP-MUD iterative processing is finished: it uses the final estimated probabilities of all possible symbols from the modulation constellation for each code channel, i.e. for each signature. In other words, the BP-MUD performance is determined by the performance of the estimation of transmitted modulation symbols, meaning that the bits inside these symbols are not directly estimated.

If we denote a modulation symbol modulating a signature as a symbol variable, then the detection of concurrently transmitted modulation symbols is performed in an iterative way, using the sparse connections between the energy of each chip and the subsets of the symbol variables contributing to the energy of each particular chip. These sparse connections are defined by the non-zero elements in each row of the LDS signature matrix.

On the AWGN channel, the connections between each chip and the corresponding symbol variables allow almost ML detection performance of the sequence of n symbol variables transmitted in a LDS transmission interval, but in the same time might be source of a relatively long sequence of erroneously detected symbol variables. The numerical simulations confirmed that it happens indeed, even at high signal-to-noise ratios (SNR) at the receiver: even if the average symbol or bit error rate is quite low, after averaging over a large number of LDS transmission intervals, the instantaneous error rate, obtained as the number of erroneously detected symbols in a single LDS transmission interval, can be rather high—sometimes more than 50% of n concurrently transmitted modulation symbols can be erroneously detected. These erroneous LDS reception intervals are followed by a large number of correct reception intervals, which make the overall, average error rate low.

Such burst-error behaviour of LDS BP-MUD on the AWGN channel seems to be its fundamental inherent property, which is not noticeable when the LDS transmission is without error correction coding, as it that case only the average error rate determines the performance. When the error correction encoding is included in the LDS transmission, the original code word consisting of coded bits is after modulation transformed into a code word of $N_{CWS}$ modulation symbols, where typically $N_{CWS}$ is typically much larger than the number of symbols n that can be transmitted in a single LDS transmission interval. Therefore the code word of modulation symbols has to be cut into $N_{LDS}$ segments, each consisting on n modulation symbols, so that $N_{LDS}$ transmission intervals are needed to send a single code word.

The bursts of errors of LDS BP-MUD, which may occur after reception of some segments of the code word, even on AWGN channel, result in the bursts of erroneous LLRs. The bursts of erroneous LLRs prevent correct functioning of error correction decoders designed for AWGN channels, such as Viterbi and turbo decoders. Consequently, if one compares performances of the LDS transmission to the performances of the conventional communication system on AWGN channel, both either without error correction coding, or with error correction coding, the performance of uncoded LDS transmission is relatively worse than that of coded LDS transmission. In other words, the reduction of the required received SNR which error correction code provide is less pronounced with LDS transmission than in ordinary transmission.

Hence, the error correction coding at the transmitter causes that the gap between the performance of LDS transmission and the performance of conventional transmission, both on AWGN channel, increases compared to the scenario without error correction coding using the same modulation format. The problem is how to modify LDS transmission with error correction coding over AWGN channel in order to minimize the performance gap to the conventional transmission with the same modulation and coding scheme.

SUMMARY OF THE INVENTION

An object is to provide a solution which mitigates or solves the drawbacks and problems of prior art solutions.

Another is to provide a solution which minimizes the performance gap of LDS transmissions with error correction coding over AWGN channel to the conventional transmission with the same modulation and coding scheme.

According to a first aspect, the above mentioned objects are achieved by a method for concurrent transmission of information symbols over time-frequency resource elements in a wireless communication system. The method comprises, for each transmission interval, the steps of: receiving information bits for transmission; grouping said information bits into blocks of bits; encoding each block of bits using an error correction code so as to obtain a corresponding code word; interleaving said code word by permuting the bits of said code word using a Low-Density Spreading (LDS) bit interleaver; dividing said permuted bits into a number of segments of bits; mapping each segment of bits onto n number of modulation symbols; multiplying said n number of modulation symbols with LDS signatures, each signature having m number of chips, so as to obtain n spread modulation symbols; mapping said m chips onto time-frequency resource elements; and transmitting said n spread modulation symbols over m time-frequency resource elements in said wireless communication system.

According to a second aspect, the above mentioned objects are achieved by a method for concurrent transmission of information symbols over time-frequency resource elements in a wireless communication system. The method comprises, for each transmission interval, the steps of: receiving information bits for transmission; grouping said information bits into blocks of bits; encoding each block of bits using an error correction code so as to obtain a corresponding code word; dividing the bits of said code word into a number of segments of bits; mapping each segment of bits onto n number of modulation symbols; interleaving said n modulation symbols by permuting said n modulation symbols using a LDS symbol interleaver; multiplying said n number of modulation symbols with LDS signatures, each signature having m number of chips, so as to obtain n spread modulation symbols; mapping said m chips onto time-frequency resource elements; and transmitting said n spread modulation symbols over m time-frequency resource elements.

According to a third aspect, the above mentioned objects are achieved by a corresponding method in a receiver for receiving information symbols on time-frequency resource elements in a wireless communication system. The method comprises, for each transmission interval, the steps of: receiving n modulation symbols according to any of the preceding claims; demodulating said n modulation symbols using a Belief Propagation Multi User Demodulator (BP-MUDO; deinterleaving said demodulated n modulation symbols using one or more deinterleavers in the group comprising: LDS symbol deinterleaver, LDS bit deinterleaver, and/or a channel bit deinterleaver; and decoding said deinterleaved n modulation symbols using an error correction decoder.

According to a fourth aspect, the above mentioned objects are achieved with a transmitter device arranged for concurrent transmission of information symbols over time-frequency resource elements in a wireless communication system. The transmitter device comprises: a receiver arranged for receiving information bits for transmission; a processor arranged for grouping said information bits into blocks of bits; an encoder arranged for encoding each block of bits using an error correction code so as to obtain a corresponding code word; an interleaver arranged for interleaving said code word by permuting the bits of said code word using a Low-Density Spreading (LDS) bit interleaver; a processor arranged for dividing said permuted bits into a number of segments of bits; a mapping unit arranged for mapping each segment of bits onto n number of modulation symbols; a multiplier arranged for multiplying said n number of modulation symbols with LDS signatures, each signature having m number of chips, so as to obtain n spread modulation symbols; a mapping unit arranged for mapping said m chips onto time-frequency resource elements; and a transmitter arranged for transmitting said n spread modulation symbols over m time-frequency resource elements in said wireless communication system.

According to a fifth aspect, the above mentioned objects are achieved with a transmitter device arranged for concurrent transmission of information symbols over time-frequency resource elements in a wireless communication system. The transmitter device comprises: a receiver arranged for receiving information bits for transmission; a processor arranged for grouping said information bits into blocks of bits; an encoder arranged for encoding each block of bits using an error correction code so as to obtain a corresponding code word; a processor arranged for dividing the bits of said code word into a number of segments of bits; a mapping unit arranged for mapping each segment of bits onto n number of modulation symbols; an interleaver arranged for interleaving said n modulation symbols by permuting said n modulation symbols using a LDS symbol interleaver; a multiplier arranged for multiplying said n number of modulation symbols with LDS signatures, each signature having m number of chips, so as to obtain n spread modulation symbols; a mapping unit arranged for mapping said m chips onto time-frequency resource elements; and a transmitter arranged for transmitting said n spread modulation symbols over m time-frequency resource elements.

According to a sixth aspect, the above mentioned objects are achieved with a corresponding receiver device arranged for receiving information symbols on time-frequency resource elements in a wireless communication system. The receiver device comprises: a receiver arranged for receiving n modulation symbols; a demodulator arranged for demodulating said n modulation symbols using a Belief Propagation Multi User Demodulator (BP-MUD); a deinterleaver arranged for deinterleaving said demodulated n modulation symbols using one or more deinterleavers in the group comprising: LDS symbol deinterleaver, LDS bit deinterleaver, and/or a channel bit deinterleaver; and a decoder arranged for decoding said deinterleaved n modulation symbols using an error correction decoder.

The present method may be comprised in a computer program which when run by processing means causes the processing means to execute the present method. A computer program product may comprise the computer program and a computer readable medium.

The present invention provides a solution which improves transmission performance when performing error correction coded LDS transmissions in wireless communication system. This is especially the case for the AWGN channel and in the overloaded case when the number of concurrently transmitted symbols exceeds the number of resource elements (or chips) for transmission.

Further applications and advantages of the invention will be apparent from the following detailed description.

BRIEF DESCRIPTION OF THE DRAWINGS

The appended drawings are intended to clarify and explain different embodiments of the present invention in which.

DETAILED DESCRIPTION OF THE INVENTION

Figure 1:
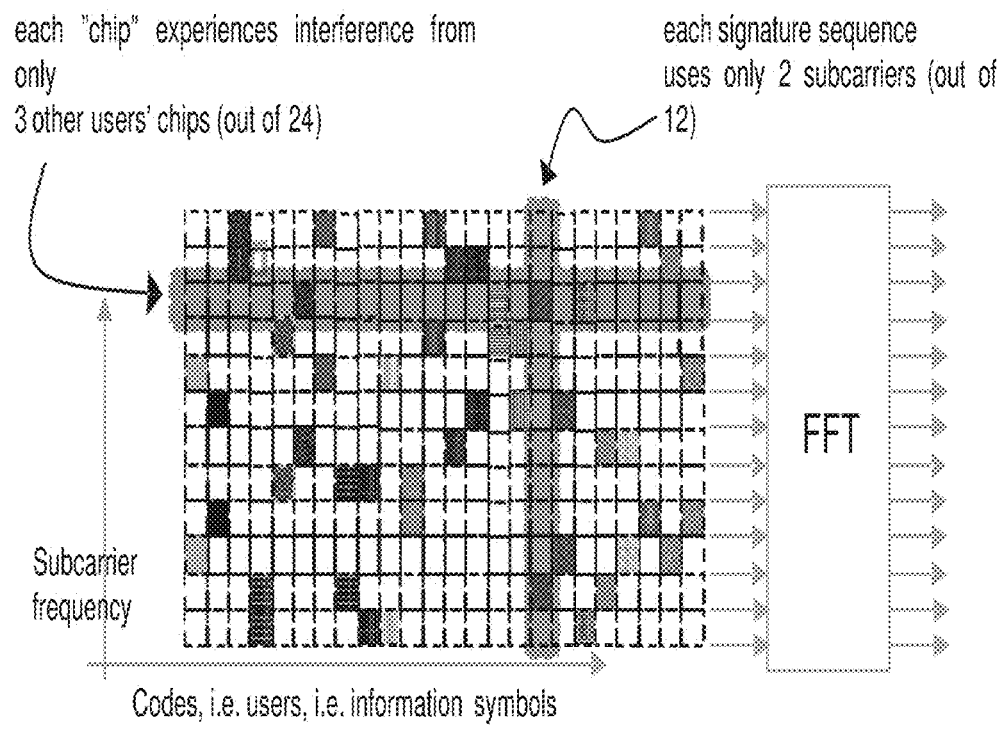
FIG. 1 illustrates the concept of LDS-OFDM transmission.
Figure 2:
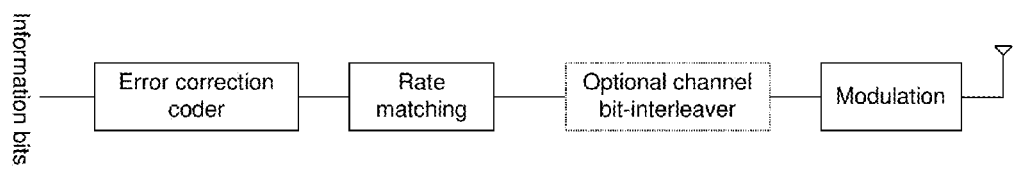
FIG. 2 is a block diagram of a transmitter in a conventional digital communication system.
Figure 3:
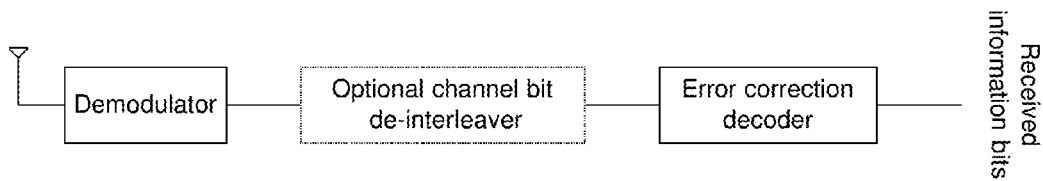
FIG. 3 is a block diagram of a receiver of a conventional digital communication system.
Figure 4:
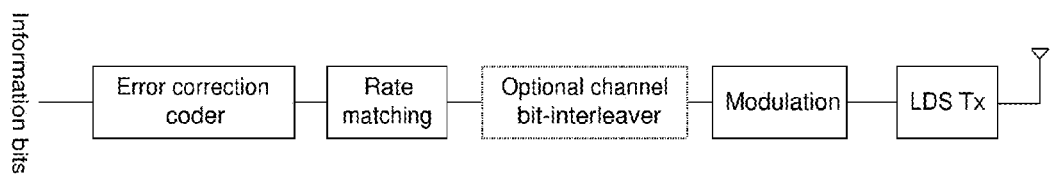
FIG. 4 is a block diagram of a transmitter in the state-of-the-art LDS communication system.
Figure 5:
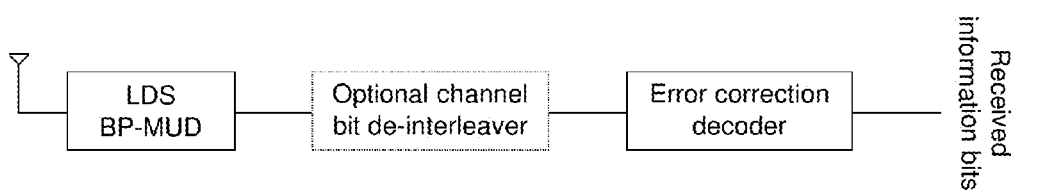
FIG. 5 is a block diagram of the state-of-the-art receiver in a LDS communication system.
Figure 6:
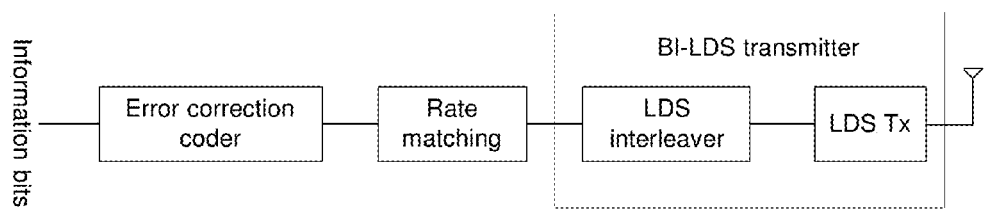
FIG. 6 is a block diagram of a transmitter in a BI-LDS communication system.
Figure 7:
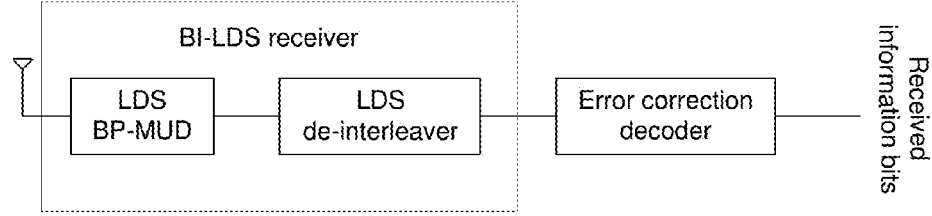
FIG. 7 is a block diagram of a receiver in a BI-LDS communication system.

In order to evenly distribute symbol errors generated by the LDS BP-MUD in one LDS reception interval, and create a uniform distribution of errors on soft-bit values that are fed to the error correction decoder, additional functions are introduced in the LDS transmitter and receiver according to the present invention. The functions are called LDS interleaver and LDS deinterleaver in this disclosure. Such transmission scheme is called Bit-Interleaved LDS (BI-LDS), and the corresponding basic transmitter and receiver chains are shown in FIGS. 6 and 7, respectively. A general idea is to combine coded bits interleaving with symbol spreading using LDS signatures. Thereby, the performance of coded LDS transmissions can be substantially improved. The present invention shows even better performance in an overloaded LDS transmission scheme, where the number of concurrently transmitted symbols (n) exceeds the number of resource elements or chips (m) used for the transmission. Hence, overloaded LDS transmission is a preferred embodiment.

The present LDS interleaver performs permutation of coded bits and/or corresponding modulation symbols so that the information bits transmitted in each of the previously mentioned segments of the code word are selected from as far as possible positions in the original code word. After the corresponding LDS deinterleaving in the receiver the bursts of erroneously estimated soft-values of information bits are uniformly distributed over the whole code word, and hence transmission performance is improved.

Figure 8:
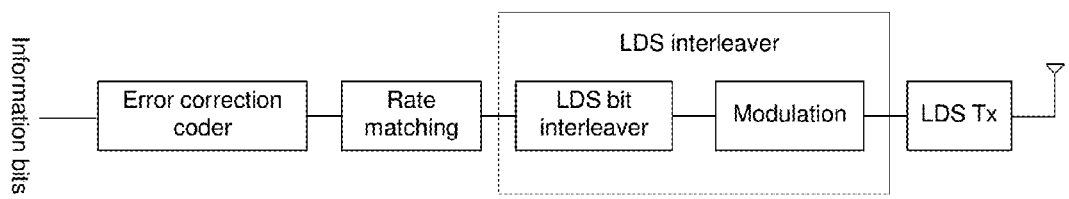
FIG. 8 is a block diagram of the transmitter in a BI-LDS communication system using a LDS bit interleaver.

According to an embodiment, the LDS interleaver can be implemented as a specially designed LDS bit interleaver, followed by a modulator as shown in FIG. 8. The LDS interleaver is located before the LDS transmitter in the transmitter chain. According to this embodiment for each transmission interval, embodiments comprise the steps of: receiving information bits for transmission; grouping the information bits into blocks of bits; encoding each block of bits using an error correction code so as to obtain a corresponding code word; interleaving the code word by permuting the bits of the code word using a LDS bit interleaver; dividing the permuted bits into a number of segments of bits, wherein the number of segments depends on the code word length; mapping each segment of bits onto n number of modulation symbols; multiplying the n number of modulation symbols with LDS signatures, each signature having m number of chips, so as to obtain n spread modulation symbols; mapping the m chips onto time-frequency resource elements; and transmitting the n spread modulation symbols over m time-frequency resource elements.

It is noted that a rate matching unit is located before the LDS interleaver in the transmitter chain in the embodiment in FIG. 8. The rate matcher adjusts the size of the code word based on available time-frequency resources for transmission.

The LDS bit interleaver that maximises the minimum distance between any two coded bits transmitted in any of the LDS transmission intervals corresponding to different segments of a single error correction code word is denoted as a Maximum Distance Separable (MDS) bit interleaver which is used according to another embodiment of the present invention. The MDS bit interleaver maps any two neighbouring bits in the original code word into two new positions in the interleaved code word so that the minimum distance between such two new positions cannot be larger for given error correction code word length, and given number of columns in the LDS signature matrix.

Figure 16:
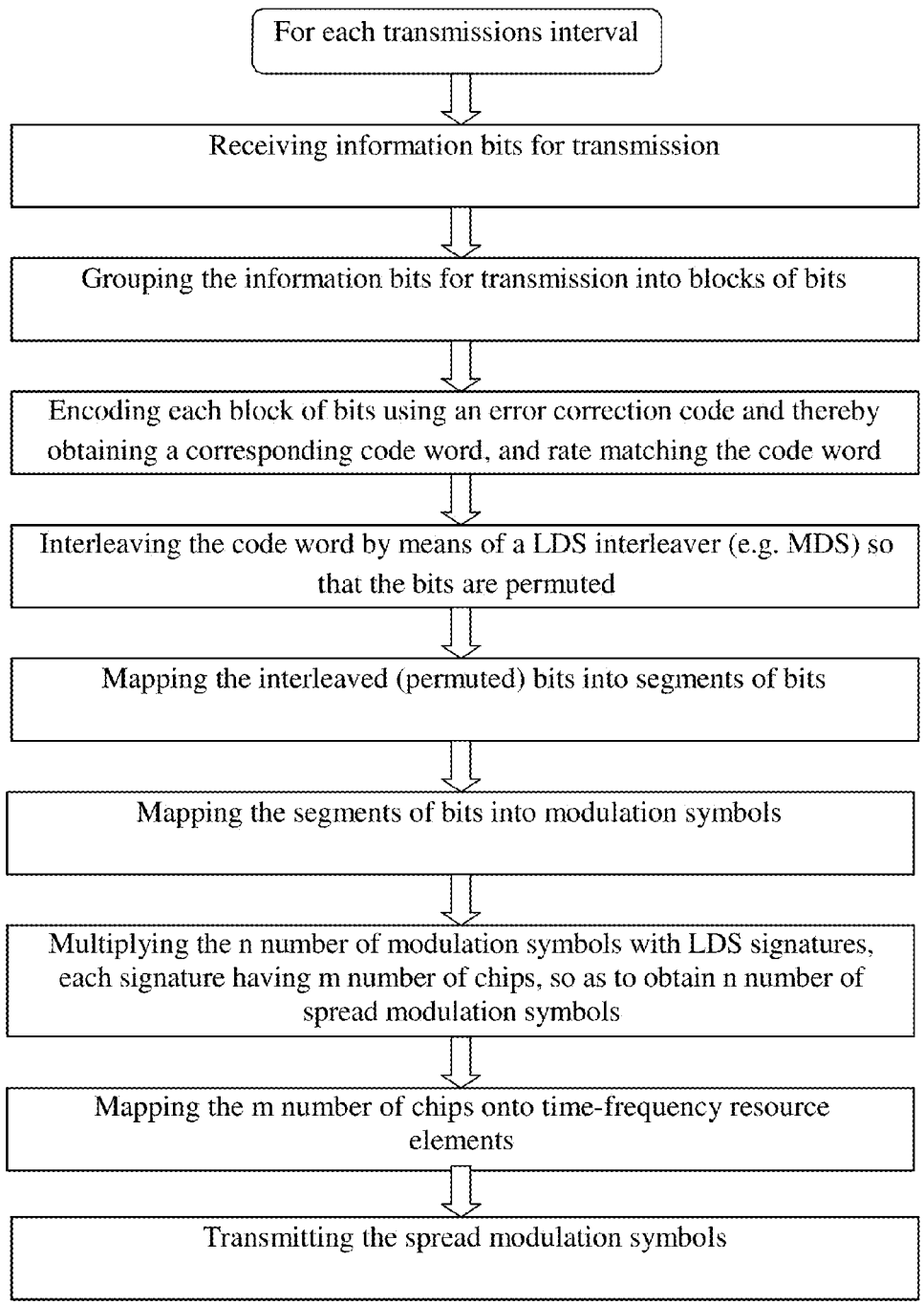
FIG. 16 shows a flowchart of a method in a transmitter according to an embodiment.

FIG. 16 shows a flow chart of an embodiment of a transmission method. In this embodiment, a rate matching unit is part of the method. Regarding the interleaver, preferably a MDS interleaver is used as a LDS interleaver in this example.

Figure 9:
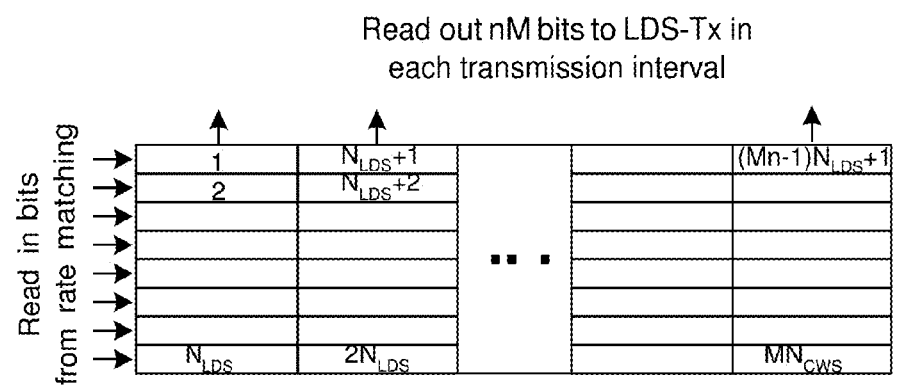
FIG. 9 is a block diagram of a MDS type of LDS bit interleaver.

The MDS bit interleaver can be implemented as a matrix shown in FIG. 9 according to yet another embodiment. The MDS type of LDS interleaver can be described as a matrix of size $N_{LDS} \times nM$, wherein M being the number of bits transmitted in each modulation symbol, and where the whole code word of $N_{CWB}=M \cdot N_{CWS}$ bits is written column-wise into the matrix, and where the complete rows are successively read into the LDS transmitter at successive transmission intervals.

Figure 10:
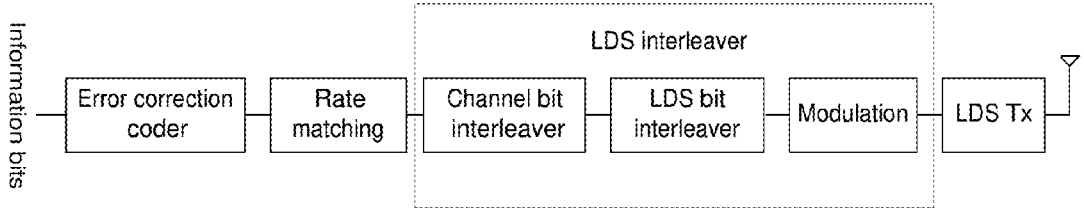
FIG. 10 is a block diagram of a transmitter in the BI-LDS communication system with a channel bit interleaver.

According to another embodiment, a channel bit interleaver that already may be incorporated in the transmission chain (e.g. to support communication over fading channels) can be used in the LDS interleaver as shown in FIG. 10. According to this embodiment, the LDS bit interleaver complements the channel bit interleaver. The LDS bit interleaver in this embodiment performs two functions: a) possibly permutes the bits received after the channel bit interleaver, acting in that way as a complementary bit interleaver that complements the performances of the channel bit interleaver with respect to the LDS transmission; b) reformats the permuted bits of a code word into LDS segments, which are then after modulator successively fed into the LDS transmission block.

Figure 11:
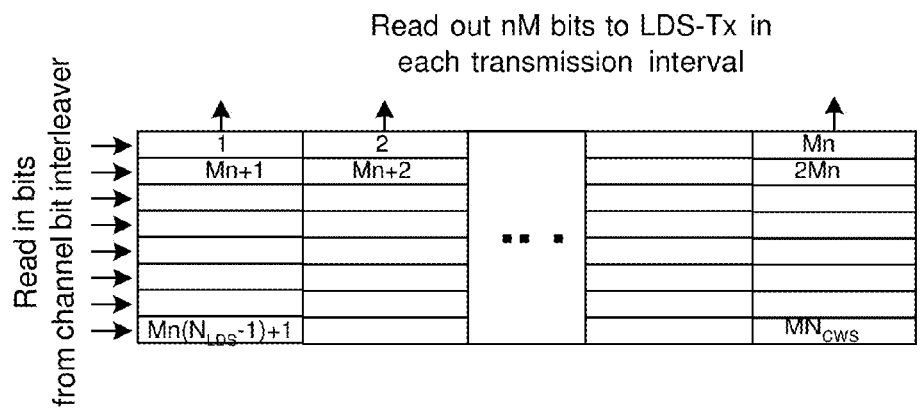
FIG. 11 is a block diagram of a LDS bit interleaver preserving the properties of an existing channel bit interleaver.

The function of a) described above can be "shortcut" (not active) if one wants to preserve the permutation of channel bit interleaver. In that case the LDS bit interleaver can be implemented as a matrix of size $N_{LDS} \times nM$, where interleaved code word of $N_{CWB}=M \cdot N_{CWS}$ bits from the output of channel bit interleaver is written row-wise into the matrix, and then where the complete rows are successively read into the LDS transmitter at successive transmission intervals. This is illustrated in FIG. 11. For example, if the function of LDS transmission is added to the existing LTE downlink transmission, the existing LTE channel bit interleaver can be used to support the LDS bit interleaver.

Figure 12:
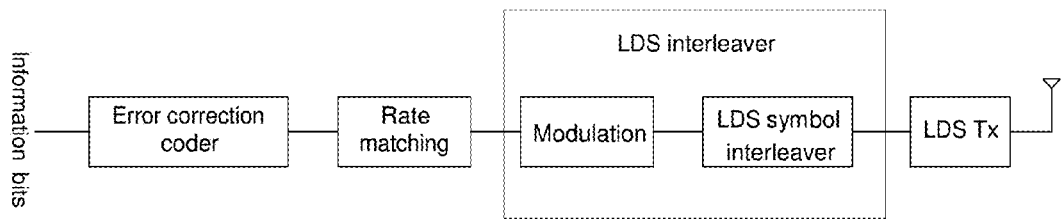
FIG. 12 is a block diagram of a transmitter in the BI-LDS communication system using a LDS symbol interleaver.

According to yet another embodiment, the LDS interleaver is implemented as a symbol interleaver, inserted after the symbol modulator which means that the LDS interleaver and the modulator are located in reverse order in the transmitter chain compared to the embodiments shown in FIGS. 8 and 10. This embodiment is illustrated in FIG. 12. This embodiment comprises the steps of: receiving information bits for transmission; grouping the information bits into blocks of bits; encoding each block of bits using an error correction code so as to obtain a corresponding code word; dividing the bits of the code word into a number of segments of bits; mapping each segment of bits onto n number of modulation symbols; interleaving the n modulation symbols by permuting the n modulation symbols using a LDS symbol interleaver; multiplying the n number of modulation symbols with LDS signatures, each signature having m number of chips, so as to obtain n spread modulation symbols; mapping the m chips onto time-frequency resource elements; and transmitting the n spread modulation symbols over m time-frequency resource elements.

Figure 13:
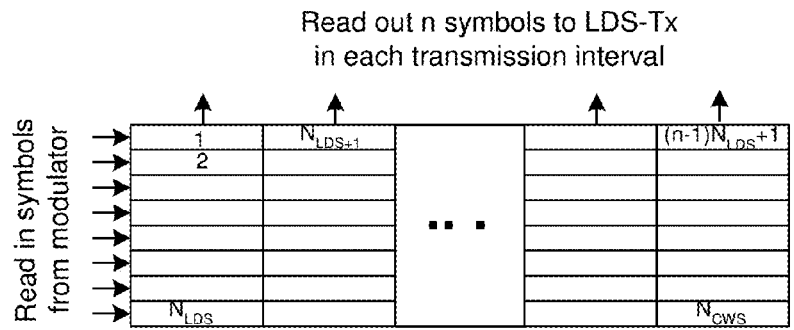
FIG. 13 is a block diagram of MDS type of LDS symbol interleaver.

Furthermore, the MDS-type of LDS symbol interleaver in the LDS interleaver block is shown in FIG. 13. Hence, the MDS-type of LDS symbol interleaver can be represented as a matrix of size $N_{LDS} \times n$, where n is the number of symbols transmitted in each of $N_{LDS}$ number of transmission intervals, and wherein the whole of the code word of $N_{CWS}=N_{LDS} \cdot n$ symbols is written column-wise into the matrix and the complete rows of the matrix are successively read out for each successive transmission interval.

The corresponding MDS symbol deinterleaver can be implemented as a special bit deinterleaver which produces the bit LLR values ordered according to the bit positions in the original code word.

Also in this embodiment, the modulator can be preceded by a rate matching unit such that the size of the code word is adjusted based on the available time-frequency resources for transmission.

Embodiments further relates to a corresponding method for receiving information symbols on time-frequency resource elements in a wireless communication system. The method comprises the steps of: receiving n modulation symbols according to any of the methods described; demodulating the n modulation symbols using a BP-MUD; deinterleaving the demodulated n modulation symbols using one or more deinterleavers in the group comprising: LDS symbol deinterleaver, LDS bit deinterleaver, and/or a channel bit deinterleaver; and decoding the deinterleaved n modulation symbols using an error correction decoder.

One or more further processing steps may also be part of the method depending on the application, e.g. processing data for software applications, controlling hardware functions in the receiver, etc.

Figure 17:
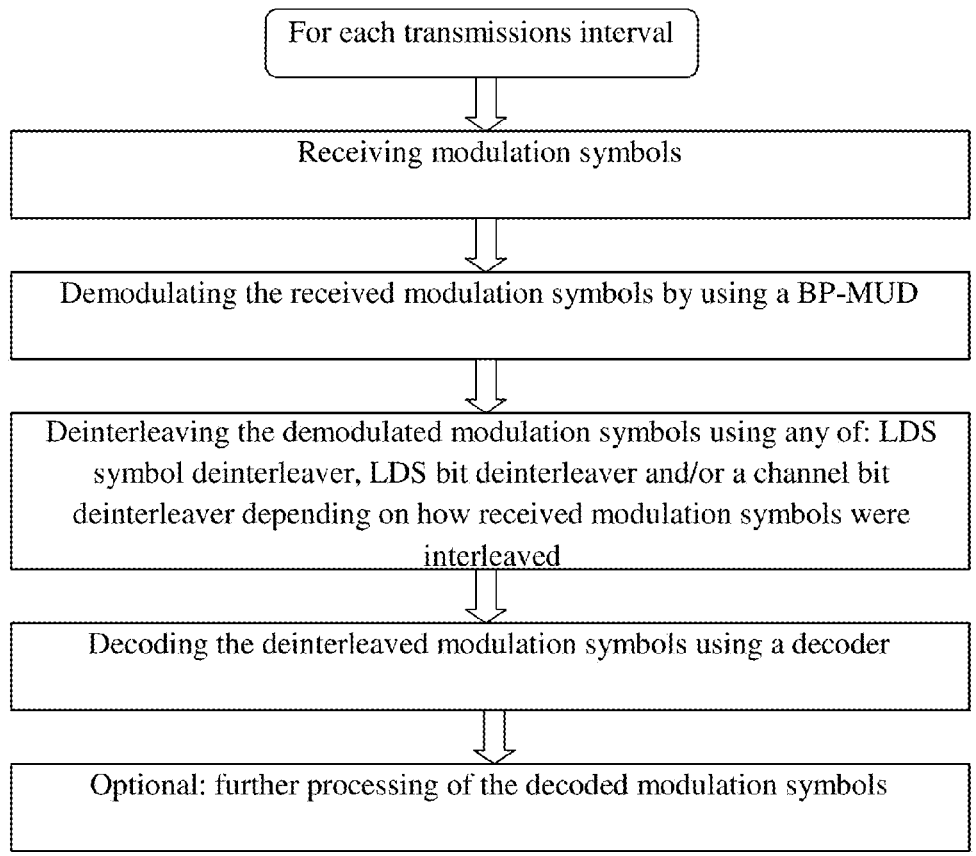
FIG. 17 shows a flowchart of a method in a receiver according to an embodiment.

FIG. 17 shows a flow chart of an embodiment of a method in a receiver. It is noted that a BP-MUD is used in this example. Further, the selection of deinterleaver depends on how the modulation symbols were interleaved at the transmitter which means that the corresponding deinterleaver should be used.

Figure 14:
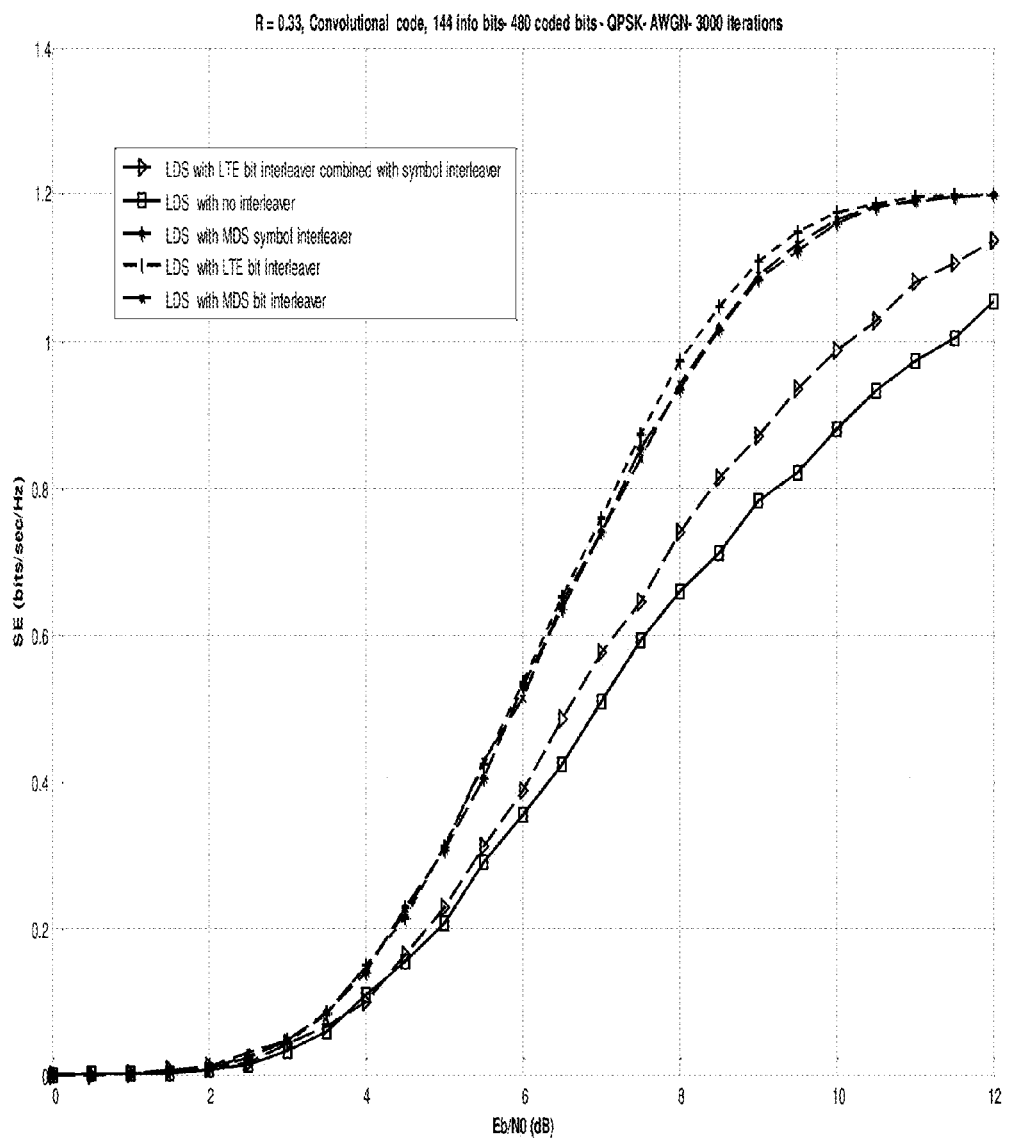
FIG. 14 shows performances of BI-LDS with different LDS interleavers.

FIG. 14 illustrates the performance advantage of the present BI-LDS over state-of-the-art LDS. The spectral efficiency of coded BI-LDS transmissions using several different LDS interleavers is evaluated on AWGN channel by using the tail-biting LTE convolutional code with constraint length 7, generators [133, 171, 165] (octal) assuming rate 1/3, code word length of 480 bits, QPSK modulation, 12×24 signature matrix and complete available 200% load of LDS.

It can be seen in FIG. 14 that at the spectral efficiency of 1 bits/sec/Hz, the BI-LDS with MDS types of LDS bit interleaver have about 3 dB SNR gain over the LDS without an LDS interleaver. It can be further seen in FIG. 14 that the LTE DL channel bit interleaver used as the basis of the LDS interleaver performs even slightly better than the MDS types of LDS bit interleaver. A possible explanation is the following: although the MDS-type of LDS interleavers ensures the maximum separation of the bits or symbols transmitted in any of the LDS transmission intervals corresponding to different segments of a single error correction code word, and thus breaks the correlation of errors introduced by BP-MUD, there might be some correlation of errors even between the LDS transmission intervals. Thus, the MDS property of LDS interleaver might not be enough to achieve the maximum possible performances. For the moment it not clear which additional criteria an LDS interleaver has to satisfy to achieve the best possible performances of LDS transmission.

Figure 15:
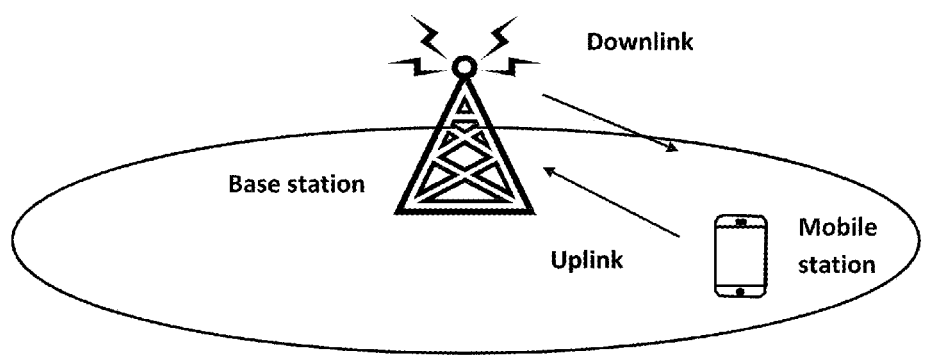
FIG. 15 shows a system overview.

It should furthermore be noted that embodiments can be implemented in a CDMA system, an OFDM system, a LDS-OFDM, or a MC-CDMA system. The system may e.g. be a cellular system in which downlink and uplink transmissions are performed. FIG. 15 illustrates such a system in which a base station transmits downlink signals to a mobile station. The system could e.g. be a system according to the 3GPP. However, the present invention is a general method for transmissions and is not limited to one particular system.

Furthermore, as understood by the person skilled in the art, any method according to the present invention may also be implemented in a computer program, having code means, which when run by processing means causes the processing means to execute the steps of the method. The computer program is included in a computer readable medium of a computer program product. The computer readable medium may comprises of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Moreover, embodiments also relate to corresponding transmitter and receiver devices. The devices are arranged to execute any method according to the present invention which means that the devices can be modified, mutatis mutandis, according to any method of the present invention. In this respect the devices comprise the necessary means, elements, units, functions, etc. Examples of such means, units, and functions are: receivers, transmitters, processors, encoders, decoders, mapping units, multipliers, interleavers, deinterleavers, modulators, demodulators, inputs, outputs, antennas, amplifiers, DSPs.

Especially, the processors of the transmitter and receiver devices may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the present invention is not limited to the embodiments described above, but also relates to and incorporates all embodiments within the scope of the appended independent claims.

What is claimed is:

1. A method, comprising:
   receiving, by a receiver, information bits for transmission;
   grouping the information bits into blocks of bits;
   encoding each block of bits using an error correction code to obtain a corresponding code word;
   interleaving the code word by permuting the information bits of the code word using a Low-Density Spreading (LDS) bit interleaver;
   dividing the permuted information bits into a plurality of segments of bits;
   mapping each segment of bits onto n number of modulation symbols;
   multiplying the n number of modulation symbols with LDS signatures, each signature having m number of chips, so as to obtain n number of spread modulation symbols;
   mapping the m number of chips onto time-frequency resource elements; and
   transmitting, by a transmitter, the n spread modulation symbols over m time-frequency resource elements in a wireless communication system.

2. The method according to claim 1, wherein the LDS bit interleaver is a Maximum Distance Separable (MDS) bit interleaver.

3. The method according to claim 2, wherein the MDS bit interleaver is a matrix of size $N_{LDS} \times nM$, M being the number of bits transmitted in each modulation symbol, $N_{LDS}$ being a number of transmission intervals, and wherein a whole of a code word of $N_{CWB} = M*n*N_{LDS}$ bits is written column-wise into the matrix and complete rows of the matrix are successively read out for each successive transmission interval.

4. The method according to claim 1, wherein the interleaving using the LDS bit interleaver is preceded by:
   interleaving using a channel bit interleaver, wherein the LDS bit interleaver complements the channel bit interleaver.

5. The method according to claim 1, wherein the interleaving is preceded by:
   adjusting a size of the code word based on available time-frequency resources for transmission.

6. A method, comprising:
   receiving the n spread modulation symbols that are transmitted according to the method of claim 1;
   demodulating the n spread modulation symbols using a Belief Propagation Multi User Demodulator (BP-MUD);
   deinterleaving the demodulated n spread modulation symbols using one or more deinterleavers in a group comprising: LDS symbol deinterleaver, LDS bit deinterleaver, and a channel bit deinterleaver; and
   decoding the deinterleaved n spread modulation symbols using an error correction decoder.

7. The method according to claim 1, wherein the wireless communication system is a Code-Division Multiple-Access (CDMA) system, an Orthogonal Frequency-Division Multiplexing (OFDM) system, Low-Density Spreading OFDM (LDS-OFDM), or a Multi-Carrier CDMA (MC-CDMA) system.

8. The method according to claim 1, wherein the n number of modulation symbols with LDS signatures exceeds the m number of chips.

9. A method, comprising:
   receiving, by a receiver, information bits for transmission;
   grouping the information bits into blocks of bits;
   encoding each block of bits using an error correction code so as to obtain a corresponding code word;
   dividing the bits of the code word into a plurality of segments of bits;
   mapping each segment of bits onto n number of modulation symbols;
   interleaving the n modulation symbols by permuting the n modulation symbols using a Low-Density Spreading (LDS) symbol interleaver;
   multiplying the n number of modulation symbols with LDS signatures, each signature having m number of chips, so as to obtain n number of spread modulation symbols;
   mapping the m chips onto time-frequency resource elements; and
   transmitting, by a transmitter, the n number of spread modulation symbols over m time-frequency resource elements.

10. The method according to claim 9, wherein the LDS symbol interleaver is a Maximum Distance Separable (MDS) symbol interleaver.

11. The method according to claim 10, wherein the MDS symbol interleaver is a matrix of size $N_{LDS} \times n$, n being a number of symbols transmitted in each of $N_{LDS}$ number of transmission intervals, and wherein a whole of a code word of $N_{CWS} = N_{LDS} \cdot n$ symbols is written column-wise into the matrix and complete rows of the matrix are successively read out for each successive transmission interval.

12. The method according to claim 9, wherein the dividing is preceded by:
   adjusting a size of the code word based on available time-frequency resources for transmission.

\* \* \* \* \*